March 1, 1966 D. L. ANTONSON 3,237,281

METHOD OF MAKING THERMOELECTRIC DEVICES

Filed Jan. 3, 1961 2 Sheets-Sheet 1

INVENTOR.
DAVID L. ANTONSON
BY
Carpenter, Abbott, Coulter & Kinney

INVENTOR.
DAVID L. ANTONSON
BY
Carpenter, Abbott, Coulter & Kinney

United States Patent Office 3,237,281 Patented Mar. 1, 1966

3,237,281
METHOD OF MAKING THERMOELECTRIC DEVICES

David L. Antonson, Woodbury Township, Washington County, Minn., assignor to Minnesota Mining and Manufacturing Company, St. Paul, Minn., a corporation of Delaware Filed Jan. 3, 1961, Ser. No. 80,468
7 Claims. (Cl. 29—155.5)

This invention relates to improvements in the art of making thermoelectric devices.

The development of improved thermoelectric materials has substantially widened the scope of practical application of devices exploiting thermoelectric phenomena. Both multiple thermoelement thermoelectric generators and multiple thermoelement thermoelectric heat pumps are being used in a wide variety of applications. Fabrication of compact, efficient and rugged thermoelectric devices of these types on a mass production basis presents formidable problems, however, not only because of the frangible nature of the thermoelectric materials used, but also because of the fact that in most constructions each of the multiple thermoelements has a separate thermojunction member electrically conductively bonded to the opposite ends thereof for connection of said thermoelements in series circuit relation.

It is a general object of the present invention to provide an improved method of making an efficient, compact and rugged multiple thermoelement thermoelectric device which method reduces to a minimum the handling of individual component parts as well as the number of individual bonding operations which must be performed, thereby substantially reducing the fabrication time required as well as the cost of such fabrication.

Another object of the invention is to provide an improved method as aforedescribed insuring proper matching of the composition as well as of the electrical properties of the thermoelements of like conductivity type in the finished device.

Another object of the invention is to provide an improved method of making a thermoelectric device which is readily adaptable to the formation of thermoelements having any selected length/area ($L/A$) ratio and which also permits ready matching of the electrical resistance of the P and the N type elements thereof, as well as ready matching of the electrical resistance of a finished device to be used for power generation to the resistance of a given load, or ready matching of the electrical requirements of a finished device to be used for heat pumping to the characteristics of a given power source.

Another object of the invention is to provide an improved method of the aforementioned character which is particularly well adapted for the fabrication of panel-like devices having thermojunction members on opposite sides thereof, said method insuring that the outer surfaces of the thermojunction members are coplanar.

Other and further objects and advantages of the invention will become apparent as the description proceeds, reference being had to the drawings accompanying and forming a part of this specification, wherein.

Figures 1, 2:
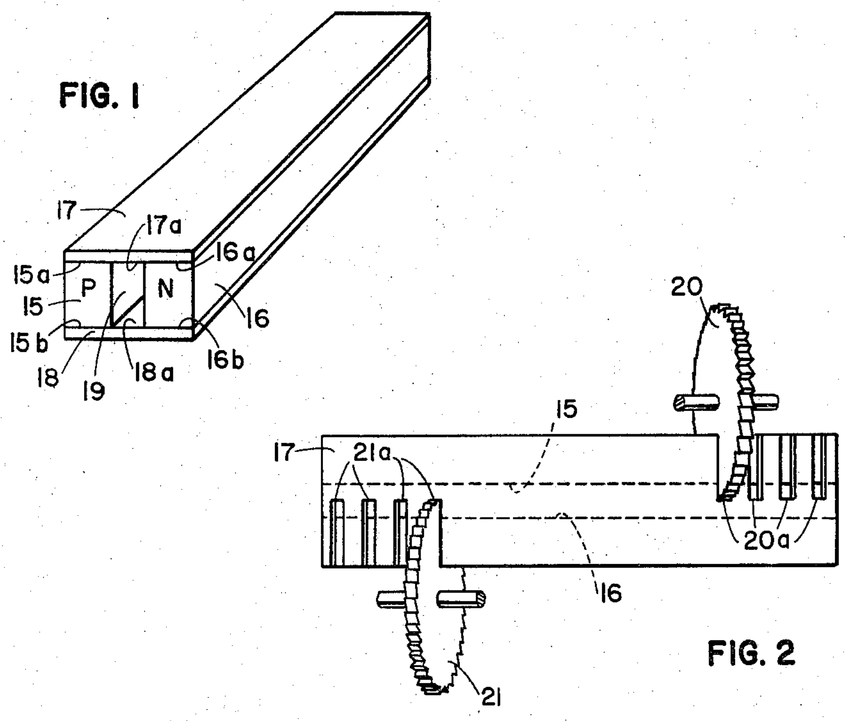
FIGURE 1 is a perspective view showing the component parts of one form of thermoelectric device after an initial assembly step in accordance with the improved method.
FIGURE 2 is a plan view of the assemblage of FIGURE 1 illustrating the forming of inclined saw cuts or slots therein.

One mode of carrying out the improved method will be described with reference to FIGURES 1 to 4 of the drawings. The component parts from which a thermoelectric device can be formed by the improved method are illustrated in FIGURE 1 as an elongated rectangular bar 15 of P-type thermoelectric material, an elongated rectangular bar 16 or N-type thermoelectric material and a pair of rectangular elongated plates 17 and 18 of electrically and thermally conductive material, for example copper. The P-type material of the bar 15 may be a semi-conductor or semi-metal of the type disclosed in Fritts and Karrer U.S. Patent No. 2,811,441, and the N-type thermoelectric material of the bar 16 may be a semi-conductor or semi-metal of the type disclosed in Fritts and Karrer U.S. Patent No. 2,811,440. Surfaces 17*a* and 18*a* of the plates 17 and 18 respectively are preferably tinned with solder, and opposite sidewall surfaces 15*a* and 15*b* of bar 15 and 16*a* and 16*b* of bar 16 are also preferably tinned with solder.

The bars 15 and 16 and plates 17 and 18 are arranged as shown in FIGURE 1 with the bars 15 and 16 in spaced parallel relation and the plates 17 and 18 in spaced parallel relation. With the parts thus arranged, heat and pressure is applied to the outer surfaces of the plates 17 and 18, as by suitable heated clamping jaws (not shown) to fuse or sweat together the contacting tinned surfaces of the bars and plates. The assembly is then cooled, as by cooling the clamping jaws or by other suitable means, and the pressure is then released. The parts of the assemblage of FIGURE 1 are now thermally and conductively bonded to each other in the laminate relation shown.

The spacing between the bars 15 and 16 and plates 17 and 18 provides a rectangular chamber 19 which may be filled with an electrically insulating reinforcing material, for example a suitable epoxy resin. The resin is placed in the chamber 19 in an uncured state and is cured in situ, firmly bonding itself to the surfaces of the bars and plates refining the wall portions of the chamber 19. The resin, when used, adds rigidity to the structure and is desirable in certain cases because of the frangible nature of the semi-conductor material of the bars 15 and 16.

Referring now to FIGURE 2, the unitary assemblage or laminate has transversely extending portions thereof removed to form the bars 15 and 16 into a plurality of spaced individual thermoelements and the plates 17 and 18 into a plurality of spaced platelets or thermojunction members. This removal may be effected by any suitable means, the presently preferred means being the forming of equally spaced inclined saw cuts extending inwardly from the opposite sides of the laminate to the center line thereof as shown in FIGURE 2. FIGURE 2 illustrates saws 20 and 21 forming slots 20*a* and 21*a* respectively. It will be observed that saws 20 and 21 are inclined in opposite directions from the vertical with respect to the plate 17. While two saw blades 20 and 21 are shown in FIGURE 2, this is only for purposes of illustration, and in actual practice a gang type of saw would be used to form all of the slots 20*a* at one time, and then by simply turning the laminate end-for-end, the same gang saw would be used to form all of the slots 21*a* at one time.

Figure 3:
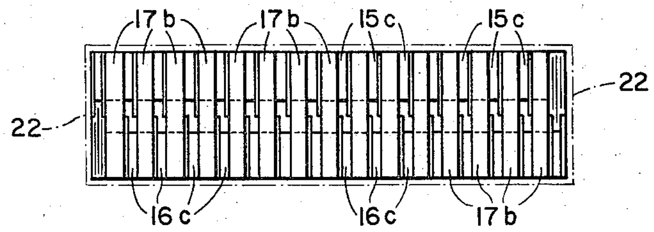
FIGURE 3 is a plan view of the assemblage of FIGURES 1 and 2 after the cutting operation of FIGURE 2 is completed.
Figure 4:
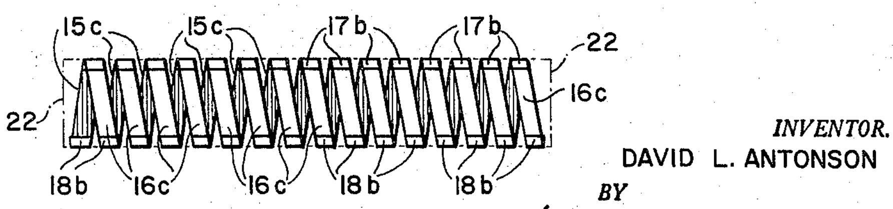
FIGURE 4 is a side elevational view of the assemblage of FIGURE 3.

The slots 20*a* form the bar 15 into a plurality of spaced P-type thermoelements 15*c* whereas the slots 21*a* form the bar 16 into a plurality of spaced N-type thermoelements 16*c*, each of which thermoelements 15*c* and 16*c* has an oblique parallelogram configuration when viewed from the side as shown in FIGURE 4. The portions of the slots 20*a* and 21*a* in the plates 17 and 18 are alined with each other and communicate with each other to form the plates 17 and 18 respectively into a plurality of spaced parallel rectangular strips or platelets 17*b* and 18*b* which function as thermojunction members. As is most clearly apparent in FIGURE 4, the thermojunction members 17*b* and 18*b* electrically connect the thermoelements 15*c* and 16*c* in alternate series circuit relation to provide a generally helical flow path from one end of the device to the other through the multiplicity of thermoelements and thermojunction members. If desired, the device as shown in FIGURES 3 and 4 may be potted in suitable insulating potting compound which fills all of the spaces therein and surrounds the entire device except for the outer surfaces of the thermojunction members 17*b* and 18*b* as shown in dot and dash lines at 22 in FIGURES 3 and 4. Suitable electrical connections to the device may be made to the thermojunction members 18*b* at each end of said device.

There are a number of advantages which accrue by virtue of the improved method. Because of the fact that the P-type thermoelements are all cut from one bar and the N-type thermoelements are all cut from another bar the electrical characteristics of the materials of all of the P-type elements are identical, and the electrical characteristics of all of the N-type elements are also identical. Further, since all of the thermojunction members 17*b* are formed from the plate 17 and all of the thermojunction members 18*b* are formed from the plate 18, the outer surfaces of all of the thermojunction members 17*b* are coplanar and the outer surfaces of all of the thermojunction members 18*b* are coplanar. The finished device is thus well adapted to be placed in direct heat conducting contact with a coacting flat surface and to afford maximum heat transfer by virtue of the aforementioned coplanar relationships.

In addition to the fact that a very compact efficient and rugged multiple thermoelement device is provided by the improved method with a minimum of handling and fabrication procedures, the improved method also permits flexibility in the design of the ultimate device to be made. For example, where the P-type material is of a higher resistivity than the N-type material, the resistance of the P-type thermoelements in the finished device can be matched to that of the N-type thermoelements by using a P-type bar 15 having a width correspondingly greater than that of the N-type bar. In order to match the resistance of the finished device to a given load or to match the electrical input requirements of the device for heat pumping to the output of a given power source, any desired size of thermoelements having any desired $L/A$ ratio can be provided by forming the device from bars 15 and 16 of greater or lesser width and height and forming the slots with greater or lesser space therebetween.

Figure 5:
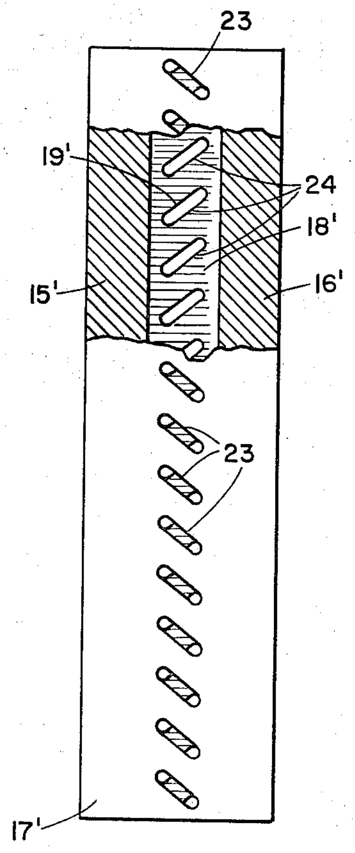
FIGURE 5 is a plan view partly in section of an assemblage similar to that of FIGURE 1 after an initial assembly step and prior to the formation of vertical saw cuts therein according to the improved method.
Figure 6:
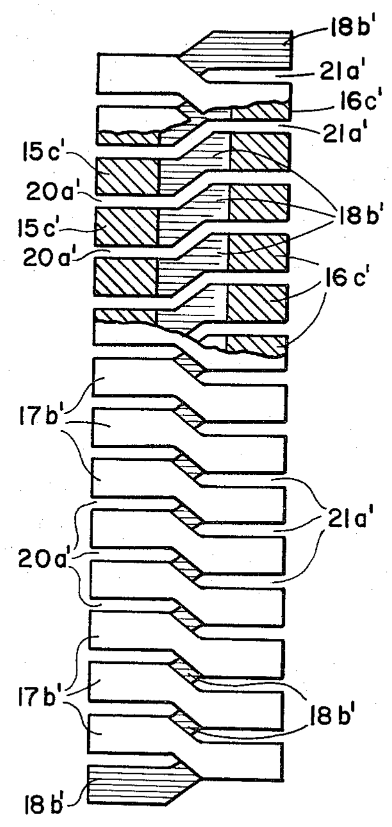
FIGURE 6 is a plan view of the assemblage of FIGURE 5 after the formation of vertical saw cuts therein.

FIGURES 5 and 6 illustrate another mode of forming a thermoelectric device in accordance with the improved method. Referring to FIGURE 5, the component parts of the initial assemblage indicated by primed reference characters correspond to and may be identical with the parts of the assemblage of FIGURE 1 indicated by the same reference characters unprimed. It will be observed in FIGURE 5 that the plate 17′ is formed along the longitudinal centerline thereof with spaced parallel angled slots 23, and that the plate 18′ is similarly formed with spaced parallel angled slots 24, which are angled in the opposite direction from the slots 23 with respect to the longitudinal centerlines or axes of the plate 17′ and 18′. The ends of the slots 24 are alined with the ends of the slots 23 as shown. The parts of the assemblage in FIGURE 5 are fused together into an integral whole by heat and pressure in the same manner as the assemblage of FIGURE 1.

The saw cutting operation described in connection with FIGURE 2 is then carried out, except that the spaced parallel saw cuts are made normal to the plates 17′ and 18′ rather than inclined with respect thereto. Saw cuts 20*a′* extend through the bar 15′ and each communicate with the end of a slot 23 adjacent the bar 15′ and with the end of the slot 24 alined therewith. Similarly, the slots 21*a′* extend through the bar 16′ and each of said slots communicates with the end of one of the slots 23 adjacent the bar 16′ and with the end of the slot 24 alined therewith. The slots 20*a′* form the bar 15′ into a plurality of spaced parallel rectangle thermoelements 15*c′*, whereas the slots 21*a′* form the bar 16′ into a plurality of spaced parallel rectangle thermoelements 16*c′*. The slots 20*a′* and 21*a′*, together with the slots 23 and 24 in plates 17′ and 18′ form said plates into a plurality of somewhat Z-shaped platelets or thermojunction members 17*b′* and 18*b′* which connect the thermoelements 15*c′* and 16*c′* in alternate series circuit relation to provide a generally helical flow path through the device from one end thereof to the other.

Various changes and modifications may be made in the illustrated method without departing from the spirit of the invention, and all of such changes are contemplated as may come within the scope of the appended claims.

What is claimed as the invention is:

1. The method of forming a thermoelectric device comprising the steps of (1) arranging in spaced parallel relation an elongated bar of P-type and an elongated bar of N-type thermoelectric material; (2) electrically conductively bonding first contact plate means to one side of both bars and second contact plate means to the opposite side of both bars; (3) forming a plurality of first slots extending through said P-type bar and the portions of said plates bonded thereto to divide the P-type bar into a plurality of spaced P-type thermoelements; and (4) forming a plurality of second slots in said N-type bar and in the portions of said plates bonded thereto to divide the N-type bar into a plurality of spaced N-type thermoelements, each of which first slots connects through the first plate to one of said second slots in said N-type bar and also connects through the second plate to a second slot in said N-type bar next adjacent said one of said second slots to divide said first contact plate means into a plurality of spaced first thermojunction members and said second contact plate means into a plurality of spaced second thermojunction members; each of said first members electrically connecting a P-type thermoelement to an N-type thermoelement and each of said second members electrically connecting one P-type thermoelement to an N-type thermoelement next adjacent the N-type thermoelement to which said one P-type thermoelement is connected by a said first member, thereby providing a generally helical current flow path through the device.

2. The method defined in claim 1 wherein the slots in said contact plate means and the slots in said thermoelectric bars are sawed simultaneously.

3. The method defined in claim 1 wherein the slots in said contact plate means are formed at least in part prior to the bonding step (2).

4. The method defined in claim 1 and including the additional step of filling the space between said adjacent elongated bars and between said first and second contact plate means with an electrically insulating reinforcing medium which bonds to said bars and contact plate means before carrying out the steps of forming slots in the bars.

5. The method of forming a thermoelectric device comprising the steps of (1) arranging in spaced parallel relation an elongated bar of P-type and an elongated bar of N-type thermoelectric material, each of uniform rectangular cross section; (2) electrically conductively bonding a first planar contact plate to one side of both bars and a second planar contact plate to the opposite side of both bars; (3) forming in said P-type bar and in the portions of said plates bonded thereto a plurality of first slots extending obliquely to the planes of said contact plates to divide the P-type bar into a plurality of spaced P-type thermoelements in the shape of oblique parallelepipeds; and (4) forming in said N-type bar and in the portions of said plates bonded thereto a plurality of second slots extending obliquely to the planes of said contact plates to divide the N-type bar into a plurality of spaced N-type thermoelements in the shape of oblique parallelepipeds; said first slots intersecting with said second slots in each of said contact plates to divide said first contact plate into a plurality of spaced first thermojunction platelets of rectangular shape and said second contact plate into a plurality of spaced second thermojunction platelets of rectangular shape, each of said first platelets electrically connecting a P-type thermoelement to an N-type thermoelement and each of said second platelets electrically connecting one P-type thermoelement to an N-type thermoelement next adjacent the N-type thermoelement to which said one P-type thermoelement is connected by a said first platelet, thereby providing a generally helical current flow path through said P-type and N-type thermoelements in alternate series circuit relation.

6. The method of forming a thermoelectric device comprising the steps of (1) arranging in spaced parallel relation an elongated bar of P-type and an elongated bar of N-type thermoelectric material; (2) electrically conductively bonding a first contact plate to one side of both bars and a second contact plate to the opposite side of both bars and parallel to the first contact plate, each of which plates is preformed with a plurality of openings distributed over the length of said bars; (3) forming a plurality of first slots extending through said P-type bar and portions of said plates bonded thereto to divide the P-type bar into a plurality of spaced P-type thermoelements; and (4) forming a plurality of second slots extending through said N-type bar and portions of said plates bonded thereto to divide the N-type bar into a plurality of spaced N-type thermoelements, each of which first slots connects through one of said preformed openings in said first plate to one of said second slots in said N-type bar and also connects through one of said preformed openings in said second plate to a second slot in said N-type bar next adjacent said one of said second slots to divide said first contact plate into a plurality of spaced thermojunction members and said second contact plate into a plurality of spaced second thermojunction members; each of said first members electrically connecting a P-type thermoelement to an N-type thermoelement and each of said second members electrically connecting one P-type thermoelement to an N-type thermoelement next adjacent the N-type thermoelement to which said one P-type thermoelement is connected by a said first member, thereby providing a generally helical current flow path through the device.

7. The method according to claim 6 wherein said preformed openings of each plate are elongated and extend generally transversely in registry with the space between the thermoelectric bars but decussate with respect to the preformed openings of the other plate and with the ends of each opening in one plate alined with an end of an opening in the other plate, and said first and second slots are formed along planes substantially normal to said plates, the planes of said first slots being intermediate the planes of said second slots.

References Cited by the Examiner

UNITED STATES PATENTS

| | | | |
|---|---|---|---|
| 2,597,674 | 5/1952 | Robbins | 338—195 |
| 2,672,492 | 3/1954 | Sukacey | 136—4 |
| 2,807,657 | 9/1957 | Jenkins et al. | 136—4 |
| 2,947,150 | 8/1960 | Roeder | 136—4.2 |
| 2,980,746 | 4/1961 | Claydon | 136—4.2 |
| 2,983,031 | 5/1961 | Blanchard | 29—155.5 |
| 3,126,616 | 3/1964 | Pietsch | 29—155.5 |

FOREIGN PATENTS

| | | |
|---|---|---|
| 811,755 | 4/1959 | Great Britain. |
| 824,347 | 11/1959 | Great Britain. |

WHITMORE A. WILTZ, *Primary Examiner.*

JOHN F. CAMPBELL, *Examiner.*